(12) United States Patent
Sakamoto et al.

(10) Patent No.: US 8,687,663 B2
(45) Date of Patent: Apr. 1, 2014

(54) LASER DEVICE

(71) Applicant: Fujikura Ltd., Tokyo (JP)

(72) Inventors: Akira Sakamoto, Sakura (JP); Nozomu Toyohara, Sakura (JP); Yohei Kasai, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/628,944

(22) Filed: Sep. 27, 2012

(65) Prior Publication Data

US 2013/0022067 A1 Jan. 24, 2013

Related U.S. Application Data

(63) Continuation of application No. PCT/JP2011/057589, filed on Mar. 28, 2011.

(30) Foreign Application Priority Data

Mar. 31, 2010 (JP) ................................. 2010-084165

(51) Int. Cl.
*H01S 3/04* (2006.01)

(52) U.S. Cl.
USPC ............................................... 372/34; 372/36

(58) Field of Classification Search
USPC .................................................... 372/34, 36
See application file for complete search history.

(56) References Cited

U.S. PATENT DOCUMENTS

| 6,146,025 | A | 11/2000 | Abbink et al. | |
|---|---|---|---|---|
| 2003/0108304 | A1* | 6/2003 | Ziari et al. | 385/92 |
| 2006/0056788 | A1 | 3/2006 | Williamson | |

FOREIGN PATENT DOCUMENTS

| CN | 1886685 A | 12/2006 |
|---|---|---|
| JP | 63-193113 A | 8/1988 |
| JP | 1-225909 A | 9/1989 |
| JP | 01-306804 | * 12/1989 |
| JP | 2000-124538 A | 4/2000 |
| JP | 2006-509254 A | 3/2006 |
| JP | 2007-256665 A | 10/2007 |

OTHER PUBLICATIONS

Xiaodong Zeng, et al., Coupling light from a laser diode into a multimode fiber, Applied Optics, Aug. 1, 2003, pp. 4427-4430, vol. 42, No. 22.
Min-Ching Lin, et al., "High-Power Laser Module with High Coupling Wedge-shaped Fiber," Opto-Electronics and Communications Conference, 2008 and the 2008 Australian Conference on Optical Fiber Technology, OECC/ACOFT 2008, Joint conference of the Volume, Issue, Jul. 7-10, 2008, pp. 1-2.
Chinese Office Action dated Jan. 6, 2014, issued in Chinese Patent Application No. 201180016339.5.

* cited by examiner

*Primary Examiner* — Armando Rodriguez
(74) *Attorney, Agent, or Firm* — Sughrue Mion, PLLC

(57) ABSTRACT

The laser device includes a semiconductor laser element having an emission surface from which laser light is emitted, an optical fiber having an end part facing the emission surface, and an optical fiber supporting member which (i) supports the optical fiber and (ii) has a bonding pad to which the optical fiber is fixed by solder. The optical fiber supporting member includes a beam part having (i) a first main surface on which the bonding pad is provided and (ii) a second main surface opposite to the first main surface, and a pillar part which is fixed to a base and is joined to the beam part on an end portion of the beam part such that the second main surface and the base face each other while being spatially away from each other.

7 Claims, 6 Drawing Sheets

LASER DEVICE

This application is a Continuation of PCT International Application No. PCT/JP2011/057589 filed in Japan on Mar. 28, 2011, which claims the benefit of Patent Application. No. 2010-084165 filed in Japan on Mar. 31, 2010, the entire contents of which are hereby incorporated by reference.

TECHNICAL FIELD

The present invention relates to a laser device including (i) a laser element such as a semiconductor laser element and (ii) an optical component such as an optical fiber.

BACKGROUND ART

In recent years, laser devices including semiconductor laser (also called "laser diode (LD)") elements have been commercialized and used in the optical communication field. In such a laser device, (i) a semiconductor laser element and an optical fiber are optically coupled with each other with a high optical coupling efficiency, and (ii) laser light, which is emitted by the semiconductor laser element, enters the optical fiber via an end part of the optical fiber.

In such a laser device, a laser light emission surface of the semiconductor laser element is precisely aligned with respect to the end part of the optical fiber so that the laser light emitted by the semiconductor laser element enters the optical fiber as much as possible. Further, it is important to maintain the aligned state.

For example, Patent Literature 1 discloses a laser diode assembly as a laser device which includes a semiconductor laser element and an optical fiber. In the laser diode assembly, a laser diode chip (here, referred to as "semiconductor laser element") and an optical fiber are provided on a base.

The semiconductor laser element and the optical fiber are fixed to the base by soldering, whereby an aligned state of a laser light emission surface of the semiconductor laser element and an end part of the optical fiber is maintained.

Particularly, in a case of a laser device which is required to have high light intensity, a multi-mode semiconductor laser element, which oscillates in a plurality of waveguide modes, is employed as a light source. The multi-mode semiconductor laser element emits light from an end of waveguide whose width falls within a range between 10 micrometers and several hundred micrometers.

In general, a spread angle of laser light emitted from such a multi-mode semiconductor laser element is approximately 40°, in terms of FWHM (Full Width at Half Maximum) in a vertical direction (perpendicular to an active layer of the semiconductor laser element) on the laser light emission surface. Moreover, in general, an FWHM angle of the laser light in a horizontal direction on the laser light emission surface becomes approximately 10° (for example, see Non Patent Literatures 1 and 2). That is, the laser light spreads more widely in the vertical direction than in the horizontal direction.

Under the circumstances, in general, the end part of the optical fiber is formed into a wedge shape so that the end part has a lens function (see Non Patent Literatures 1 and 2). This allows the laser light, which spreads widely in the vertical direction, to be efficiently optically coupled with the optical fiber, and accordingly a larger amount of laser light can be caused to enter a core part of the optical fiber.

CITATION LIST

Patent Literature

[Patent Literature 1]
Japanese Patent Application Publication Tokukai No. 2000-124538 A (Publication date: Apr. 28, 2000)

Non Patent Literatures

[Non Patent Literature 1]
Xiaodong Zeng and Yuying An, Coupling light from a laser diode into a multimode fiber, APPLIED OPTICS, Optical Society of America, August 2003, Vol. 42, No. 22

[Non Patent Literature 2]
Min-Ching Lin et al., High-Power Laser Module with High Coupling Wedge-Shaped Fiber, Opto-Electronics and Communications Conference, 2008 and the 2008 Australian Conference on Optical Fiber Technology, OECC/ACOFT 2008, Joint conference of the Volume, Issue, 7-10 Jul. 2008 Pages 1-2.

SUMMARY OF INVENTION

Technical Problem

According to the laser diode assembly disclosed in Patent Literature 1, a part of the laser light spreading in the vertical direction, which part does not enter the core part of the optical fiber, is absorbed by a fiber fixing section via which the optical fiber is fixed to the base. This causes the fiber fixing section to generate heat.

As a result, a temperature of the fiber fixing section is increased, and the base under the fiber fixing section can expand. Such a local expansion of the base causes the optical fiber to be positionally displaced, and therefore the optical coupling efficiency between the semiconductor laser element and the optical fiber can be decreased. That is, such a local expansion of the base causes a further reduction in laser light which enters the core part of the optical fiber.

Such a reduction in laser light which enters the core part of the optical fiber means an increase in laser light which is absorbed by the fiber fixing section. Consequently, the temperature of the fiber fixing section is further increased, and accordingly the local expansion of the base will be further accelerated.

Furthermore, such a local expansion of the base causes a further decrease in optical coupling efficiency between the semiconductor laser element and the optical fiber, and accordingly the temperature of the fiber fixing section is still further increased.

Such a vicious cycle might have eventually (i) caused a melting of solder by the heat of the fiber fixing section, and further (ii) interfered with an operation of the laser diode assembly.

It seems inevitable that the vicious cycle as above described will be promoted in accordance with a recent increase in output capacity of the semiconductor laser element. In particular, in a case where a high-output semiconductor laser whose output is more than 1 W is employed, influence of the use of such a high-output semiconductor laser on the vicious cycle is more significant.

In order to prevent such a vicious cycle, there is an increasing demand for improvement in mounting reliability against heat generation and melting of the fiber fixing section for fixing the optical fiber.

In particular, as above described, the laser light emitted by the semiconductor laser element spreads more widely in the vertical direction on the laser light emission surface than in the horizontal direction. Therefore, in a case where the optical fiber is positionally displaced in the vertical direction, a decrease in optical coupling efficiency between the semiconductor laser element and the optical fiber becomes more significant.

The present invention is accomplished in view of the problem, and its object is to provide a laser device which can suppress a decrease in optical coupling efficiency between a semiconductor laser element and the optical fiber by suppressing heat generation and melting of a fiber fixing section for fixing an optical fiber.

Solution to Problem

In order to attain the object, a laser device of the present invention includes: a laser element having an emission surface from which laser light is emitted; an optical fiber having an end part facing the emission surface; and a supporting member for supporting the optical fiber, the supporting member having a fiber fixing section to which the optical fiber is fixed by solder, the supporting member including: a plate part having (i) a first main surface on which the fiber fixing section is provided and (ii) a second main surface opposite to the first main surface; and a columnar part fixed to a heat releasing member, the columnar part being joined to the plate part in a location at or near an end of the plate part such that the second main surface and the heat releasing member face each other while being spatially away from each other.

According to the laser device, the supporting member for supporting the optical fiber has the plate part for fixing the optical fiber and the columnar part fixed to the heat releasing member. The columnar part is provided such that the plate part is spatially away from the heat releasing member. This allows a reduction in thickness of a part of the supporting member which part is located under the fiber fixing section for fixing the optical fiber.

According to the configuration, even when the fiber fixing section starts to generate heat by being irradiated with laser light which (i) has been emitted from the emission surface and (ii) does not enter a core part of the optical fiber, it is possible to reduce a degree of positional displacement of the optical fiber in the thickness direction of the plate part which displacement is caused by a thermal expansion of the supporting member under the fiber fixing section, as compared with a case where the supporting member under the fiber fixing section is thick, that is, the supporting member under the fiber fixing section is directly fixed on the heat releasing member.

It is therefore possible to suppress a decrease in optical coupling efficiency between the laser element and the optical fiber by suppressing heat generation and melting of the fiber fixing section for fixing the optical fiber.

Advantageous Effects of Invention

The laser device of the present invention includes: a laser element having an emission surface from which laser light is emitted; an optical fiber having an end part facing the emission surface; and a supporting member for supporting the optical fiber, the supporting member having a fiber fixing section to which the optical fiber is fixed by solder, the supporting member including: a plate part having (i) a first main surface on which the fiber fixing section is provided and (ii) a second main surface opposite to the first main surface; and a columnar part fixed to a heat releasing member, the columnar part being joined to the plate part in a location at or near an end of the plate part such that the second main surface and the heat releasing member face each other while being spatially away from each other.

It is therefore possible to provide the laser device which can suppress a decrease in optical coupling efficiency between the laser element and the optical fiber by suppressing heat generation and melting of the fiber fixing section for fixing the optical fiber.

BRIEF DESCRIPTION OF DRAWINGS

FIG. 1 is a schematic cross sectional view for explaining a laser device in accordance with an embodiment of the present invention.

FIG. 2 is a three-view drawing illustrating an optical fiber supporting member of the laser device illustrated in FIG. 1. (a) of FIG. 2 is a plane view illustrating the optical fiber supporting member viewed in the Z axis direction of FIG. 1. (b) of FIG. 2 is a lateral view illustrating the optical fiber supporting member viewed in the X axis direction of FIG. 1. (c) of FIG. 2 is a lateral view illustrating the optical fiber supporting member viewed in the Y axis direction of FIG. 1.

FIG. 3 illustrates the optical fiber supporting member and peripheral parts of the optical fiber supporting member in the laser device.

FIG. 4 illustrates a conventional optical fiber supporting member and peripheral parts of the conventional optical fiber supporting member.

FIG. 5 is a three-view drawing illustrating Modified Example 1 of the optical fiber supporting member of the laser device illustrated in FIG. 1. (a) of FIG. 5 is a plane view illustrating the optical fiber supporting member viewed in the Z axis direction of FIG. 1. (b) of FIG. 5 is a lateral view illustrating the optical fiber supporting member viewed in the X axis direction of FIG. 1. (c) of FIG. 5 is a lateral view illustrating the optical fiber supporting member viewed in the Y axis direction of FIG. 1.

FIG. 6 is a three-view drawing illustrating Modified Example 2 of the optical fiber supporting member of the laser device illustrated in FIG. 1. (a) of FIG. 6 is a plane view illustrating the optical fiber supporting member viewed in the Z axis direction of FIG. 1. (b) of FIG. 6 is a lateral view illustrating the optical fiber supporting member viewed in the X axis direction of FIG. 1. (c) of FIG. 6 is a lateral view illustrating the optical fiber supporting member viewed in the Y axis direction of FIG. 1.

DESCRIPTION OF EMBODIMENTS

The following description will discuss an embodiment of the present invention, with reference to FIGS. 1 through 4.

(Laser Device 100)

Figure 1:
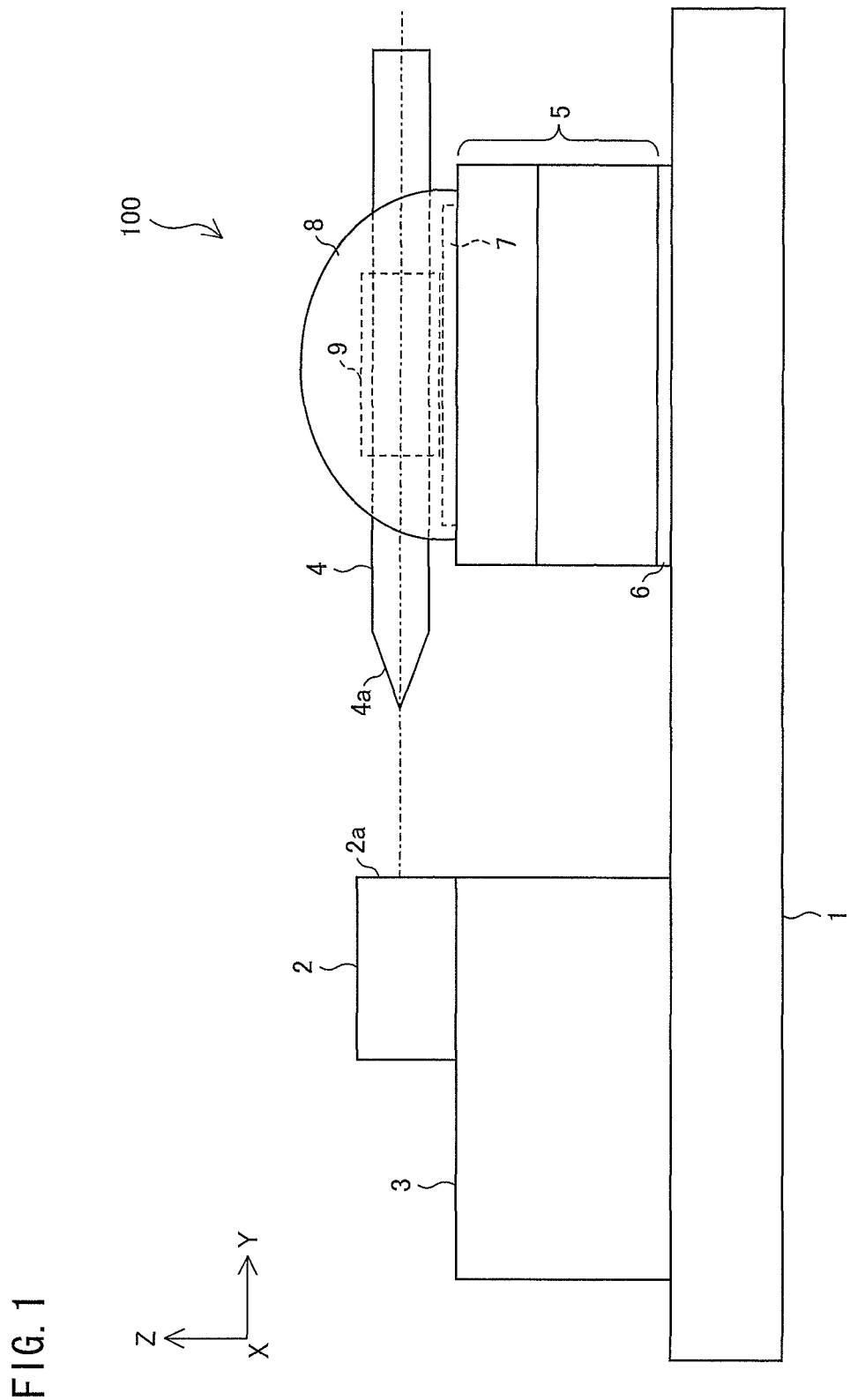
FIG. 1
Figure 2:
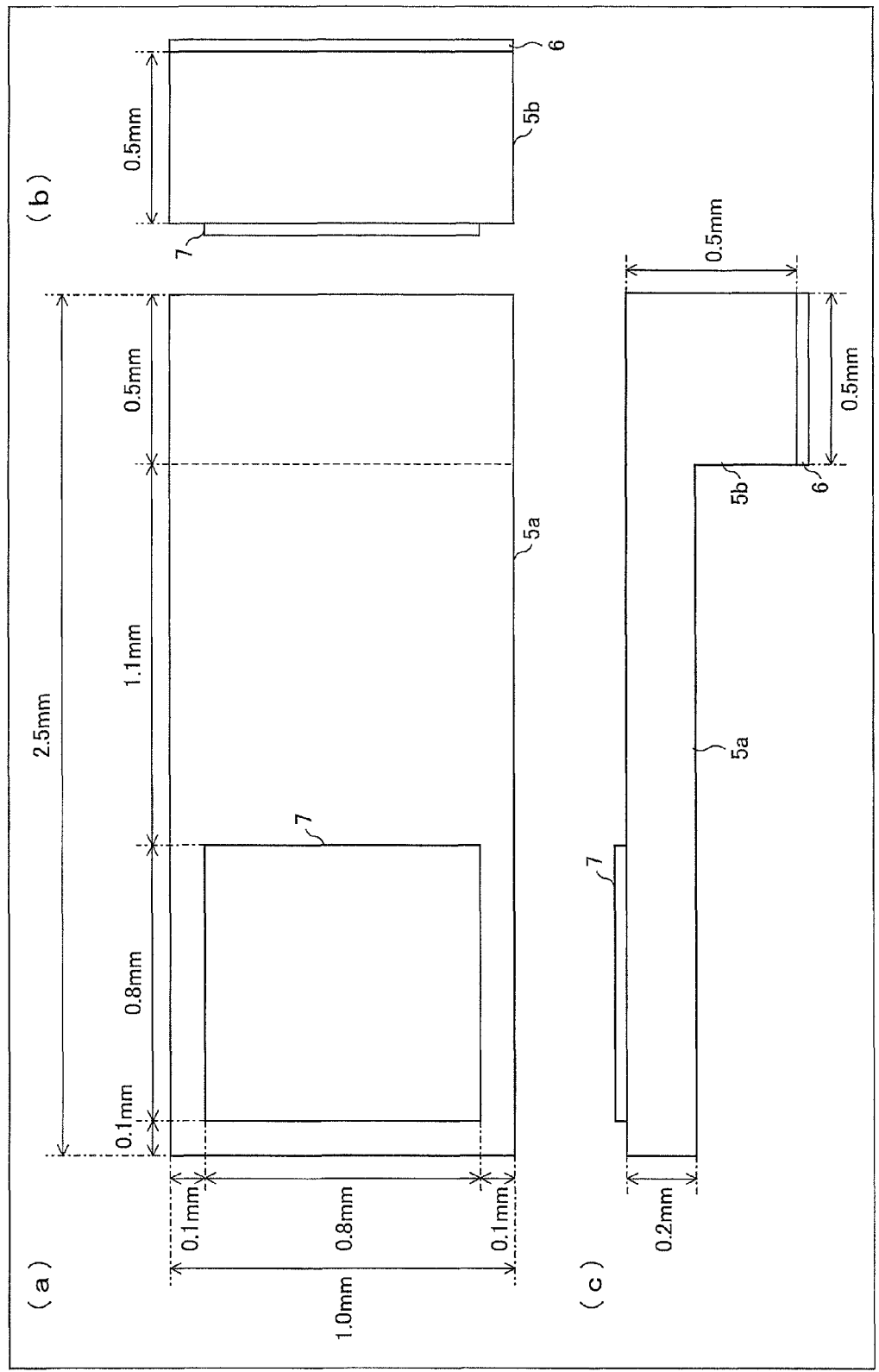
FIG. 2

First, the following description will discuss a configuration of a laser device 100 in accordance with an embodiment of the present invention, with reference to FIGS. 1 and 2. FIG. 1 is a schematic cross sectional view for explaining the laser device 100 of the present embodiment. FIG. 2 is a three-view drawing illustrating an optical fiber supporting member 5 illustrated in FIG. 1. (a) of FIG. 2 is a plane view illustrating the optical fiber supporting member 5 viewed in the Z axis direction of FIG. 1. (b) of FIG. 2 is a lateral view illustrating the optical fiber supporting member 5 viewed in the X axis direction of FIG. 1. (c) of FIG. 2 is a lateral view illustrating the optical fiber supporting member 5 viewed in the Y axis direction of FIG. 1.

The laser device 100 of the present embodiment includes a base 1, a semiconductor laser element (laser element) 2, a laser element supporting member 3, an optical fiber 4, an optical fiber supporting member (supporting member) 5, a bonding film 6, a bonding pad (fiber fixing section) 7, solder 8, and a metallic coating member 9 (see FIGS. 1 and 2).

The base 1 has, for example, a rectangular parallelepiped shape. For example, a sealing member (not illustrated) such as a package can be provided on an upper part of the base 1 so that a space for confining the semiconductor laser element 2 and the optical fiber 4 is formed by the sealing member and the base 1.

The laser element supporting member 3 and the optical fiber supporting member 5 are joined to an upper surface (main surface) of the base 1. Heat generated by the semiconductor laser element 2 is conducted to the base 1 via the laser element supporting member 3.

Similarly, heat generated by the optical fiber 4 and heat generated by a bonding pad (later described) are conducted to the base 1 via the optical fiber supporting member 5.

The base 1 is generally fixed to a heat sink or a temperature adjustment block so that heat is released, which has been thus conducted to the base 1 via the laser element supporting member 3 or the optical fiber supporting member 5.

In other words, the base 1, which is fixed to such a heat sink or a temperature adjustment block, serves as a heat releasing member for releasing heat conducted via the laser element supporting member 3 or the optical fiber supporting member 5. The base 1 is generally made of copper, by taking into consideration such a heat releasing property and manufacturing cost.

The semiconductor laser element 2 is connected with a laser driving device (not illustrated), and a driving current is supplied to the semiconductor laser element 2 from the laser driving device. The semiconductor laser element 2 has an emission surface 2a from which laser light is emitted. The emission surface 2a is arranged so as to face an end part 4a of the optical fiber 4. The semiconductor laser element 2 oscillates by receiving a driving current supplied from the laser driving device, so that laser light is emitted from the emission surface 2a by the oscillation.

According to the laser device 100 of the present embodiment, a multi-mode semiconductor laser element, which emits multi-mode light, is employed as the semiconductor laser element 2. Such a multi-mode semiconductor laser element is made of a semiconductor material such as InGaAs, AlGaAs, or InGaAsP.

The semiconductor laser element 2 emits, from the emission surface 2a, laser light which spreads at FWHM (Full Width at Half Maximum) angles of (i) approximately 40° in a Z axis direction (first direction) on the emission surface 2a and (ii) approximately 10° in an X axis direction (second direction) on the emission surface 2a, as with the conventional technique early described in "Background Art". That is, the laser light emitted by the semiconductor laser element 2 spreads more widely in a Y-Z plane than in an X-Y plane.

Note that the "X axis direction" indicates a direction, on the emission surface 2a, in parallel with a plane along which an active layer of the semiconductor laser element 2 lies. The "Z axis direction" indicates a direction, on the emission surface 2a, perpendicular to the plane along which the active layer lies.

Under the circumstances, the following phenomenon is caused: that is, in a case where the end part 4a of the optical fiber 4 is positionally displaced with respect to the emission surface 2a more largely in the Z axis direction than in the X axis direction, optical coupling efficiency (later described) between the semiconductor laser element 2 and the optical fiber 4 will be decreased more greatly.

This is because, in a case where the optical fiber 4 is positionally displaced in the Z axis direction, laser light which does not enter a core part of the optical fiber 4 will be increased, as compared to a case of a positional displacement in the X axis direction, because the laser light spreads more widely in the Z axis direction as above described.

Therefore, the optical coupling efficiency between the semiconductor laser element 2, which is of the multi-mode, and the optical fiber 4 (i) is not affected (changed) so greatly by a positional displacement of the optical fiber 4 in the X axis direction but (ii) is highly sensitively affected (changed) by a positional displacement of the optical fiber 4 in the Z axis direction.

Although it depends on a degree of a lens function provided in the end part 4a, a tolerance on the positional displacement of the optical fiber 4 in the X axis direction is, for example, approximately 10 μm, whereas a tolerance on the positional displacement in the Z axis direction is, for example, approximately 1 μm to 3 μm.

The present invention is aimed at suppressing the positional displacement of the optical fiber 4 in the Z axis direction, which displacement significantly affects a change in optical coupling efficiency between the semiconductor laser element 2 and the optical fiber 4 (details will be described later).

The laser element supporting member 3 has (i) a lower surface joined to the base 1 and (ii) an upper surface on which the semiconductor laser element 2 is provided. The laser element supporting member 3 (i) supports the semiconductor laser element 2 aligned above the base 1 and (ii) prevents the semiconductor laser element 2 from being directly affected by a distortion of the base 1, which distortion is caused by a thermal expansion or a deformation of the base 1.

The laser element supporting member 3 has a function of conducting heat generated by the laser light emission of the semiconductor laser element 2 to the base 1. Because the laser element supporting member 3 conducts heat, the heat generated by the semiconductor laser element 2 is released into the atmosphere via the base 1. This suppresses an increase in temperature of the semiconductor laser element 2 which is oscillating laser light, and therefore the oscillation of the semiconductor laser element 2 can be carried out stably. Examples of a material of the laser element supporting member 3 encompass CuW, AlN, SiC, BeO, Si, cubic boron nitride, and diamond.

The optical fiber 4 guides laser light, which has been emitted by the semiconductor laser element 2, to the outside of the laser device 100. The laser light, which has been emitted by the semiconductor laser element 2, enters the optical fiber 4 via the end part 4a.

The end part 4a has a wedge shape (see FIG. 1). As early described, laser light emitted by the semiconductor laser element 2 spreads more widely in the Z axis direction than in the X axis direction.

It is therefore necessary to guide laser light, which has been emitted by the semiconductor laser element 2 and spreads in the Z axis direction, to the core part of the optical fiber 4 by refracting the laser light so that the laser light is optically coupled with the core part more efficiently.

In order to accomplish such a configuration, the end part 4a is formed into the wedge shape so as to have a lens function.

As such, laser light which spreads in the Z axis direction (i) is refracted when the laser light enters the end part 4a having the lens function obtained by the wedge shape and (ii) is then guided in the optical fiber 4.

The end part 4a is arranged so as to face the emission surface 2a (see FIG. 1). Moreover, the end part 4a and the emission surface 2a are aligned such that laser light, which is emitted by the semiconductor laser element 2, maximally enters the core part of the optical fiber 4.

In other words, the semiconductor laser element 2 and the optical fiber 4 are aligned such that optical coupling efficiency between the semiconductor laser element 2 and the core part of the optical fiber 4 becomes maximum.

The optical fiber 4, which is included in the laser device 100 of the present embodiment, has a triplex structure containing (i) the core part, (ii) a clad part covering the core part, and (iii) a coating part coating the clad part. The "alignment between the emission surface 2a and the end part 4a" specifically means carrying out a matching of (i) an optical axis of laser light emitted by the semiconductor laser element 2 and (ii) an optical axis of the core part of the optical fiber 4 such that the laser light maximally enters the core part.

Note that a part of the optical fiber 4, which part extends between the end part 4a and a part above the bonding pad 7 (see FIG. 1), is not covered with the coating part. A part of the clad part (made of quartz), which part is not coated with the coating part and is located in the solder 8, is covered with the metallic coating member 9. This is because, in general, a coating part made of a material such as resin has such disadvantages that (i) the coating part is highly likely to be broken by melted solder applied onto the coating part and (ii) the optical fiber 4 tends to be positionally displaced significantly when the optical fiber 4 is fix onto the coating part, which is soft. Note that the metallic coating member 9 and the bonding pad 7 are not in direct contact with each other, and are apart from each other by, in general, approximately several tens of micrometers to 100 micrometers.

The optical fiber 4 may be a multi-mode fiber which can be optically coupled with the semiconductor laser element 2 which is of the multi-mode. It is preferable that the core part has a diameter of not smaller than 50 micrometers, more preferably, not smaller than 105 micrometers. It is of course preferable that the diameter of the core part of the optical fiber 4 is enlarged as an output of the semiconductor laser element 2 becomes higher. For example, the diameter of the core part can be approximately 1000 micrometers, depending on the output of the semiconductor laser element 2.

On a lower surface thereof, the optical fiber supporting member 5 is attached to the base 1 via the bonding film 6. The optical fiber 4 is attached to an upper surface of the optical fiber supporting member 5 via the bonding pad 7. The optical fiber supporting member 5 supports the optical fiber 4 aligned above the base 1.

The optical fiber supporting member 5 is made of a heat conductive material which has a high heat conductivity. Examples of the heat conductive material having a high heat conductivity encompass Ni, Mo, Si, CuW, AlN, and Cu. Heat conductivities of the heat conductive materials are as follows: 90 W/m·K (Ni), 147 W/m·K (Mo), 160 W/m·K (Si), 200 W/m·K (CuW, AlN), and 400 W/m·K (Cu). Other examples of the heat conductive material encompass Ni-ceramic, SiC (257 W/m·K), BeO (285 W/m·K), cubic boron nitride (1300 W/m·K), and diamond (2200 W/m·K). It is preferable that a heat conductivity of such a heat conductive material is not less than 50 W/m·K.

On the contrary to such heat conductive materials, examples of a heat insulating material having a low heat conductivity encompass silica (1 W/m·K), Macor (2 W/m·K), and Zirconia (3 W/m·K).

The optical fiber supporting member 5 is made of a highly heat conductive material as above exemplified. Because of this, heat generated when laser light is propagating in the optical fiber 4 can be efficiently conducted to the base 1.

The heat conductive material, which is used to form the optical fiber supporting member 5, is of course not limited to the materials above exemplified, provided that the heat conductive material of the optical fiber supporting member 5 has a heat conductivity higher than that of a heat insulating material such as glass, whose heat conductivity is extremely low.

According to the present embodiment, heat generated in the bonding pad 7 is released to the heat sink via the base 1. This makes it possible to suppress an increase in temperature of the optical fiber 4 when laser light is propagating in the optical fiber 4. This consequently allows the aligned optical fiber 4 to be stably supported.

The optical fiber supporting member 5 includes (i) a beam part (plate part) 5a having the upper surface above which the optical fiber 4 is provided and (ii) a pillar part (columnar part) 5b having the lower surface joined to the base 1 (see FIG. 2). The pillar part 5b is located at or near one of ends of the beam part 5a, which ends are located in a longitudinal direction of the beam part 5a. The beam part 5a and the pillar part 5b are integrated in one (1) piece. In the present embodiment, for convenience of explanation, the optical fiber supporting member 5 is described as being made up of two parts, i.e., the beam part 5a and the pillar part 5b.

The beam part 5a has a flat-plate shape, and the pillar part 5b has a rectangular parallelepiped shape. From this, a lateral surface of the optical fiber supporting member 5 has an L shape when viewed in the Y axis direction of FIG. 1 (see (c) of FIG. 2). The configuration of the optical fiber supporting member 5 having such an L-shaped lateral surface can be called a "cantilever configuration".

By employing the optical fiber supporting member 5 having such a cantilever configuration, the present invention makes it possible to suppress a positional displacement which significantly affects a change in optical coupling efficiency between the semiconductor laser element 2 and the optical fiber 4, that is, suppress a positional displacement of the optical fiber 4 in the Z axis direction. This effect will be described later in detail.

Note that the beam part 5a and the pillar part 5b can be (i) formed separately instead of being formed in one (1) piece and then (ii) assembled into one (1) piece so as to have the L shape.

The pillar part 5b has the lower surface joined to the base 1 via the bonding film 6. The bonding film 6 facilitates the fixation of the pillar part 5b to the base 1 by a brazing material such as solder. Examples of the bonding film 6 encompass a two-layer film containing an Ni film (upper layer) and an Au film (lower layer). In a case where the pillar part 5b is fixed, via the bonding film 6 made up of such a two-layer film, to the base 1 by a brazing material such as solder, it is possible (i) to cause the heat generated by the optical fiber 4 to be efficiently conducted to the base 1 and (ii) to certainly fix the pillar part 5b to the base 1.

On the other hand, the beam part 5a has the upper surface above which the optical fiber 4 is provided via the bonding pad 7. The bonding pad 7 facilitates the fixation of the optical fiber 4 to the upper surface of the beam part 5a by solder. Examples of the bonding pad 7 encompass a two-layer film containing an Ni film (upper layer) and an Au film (lower layer), as with the bonding film 6. In a case where the bonding pad 7 is made up of such a two-layer film, it is possible (i) to cause the heat generated by the optical fiber 4 to be efficiently conducted to the beam part 5a and (ii) to certainly fix the optical fiber 4 to the beam part 5a.

The optical fiber 4, which is provided above the upper surface of the beam part 5a, is fixed to the bonding pad 7 on the beam part 5a by the solder 8. Examples of the solder 8 encompass solder and eutectic solder each of which has a melting point of approximately 100° C. to 350° C. More specifically, examples of the solder 8 encompass (i) eutectic solder containing 63% of tin (Sn) and 37% of lead (Pb), (ii) alloy solder containing indium (In), and (iii) solder containing tin (Sn) and silver (Ag). In particular, it is preferable to employ eutectic solder containing gold (Au) and tin (Sn), in view of elimination of lead.

The metallic coating member 9 is provided so as to surround a part of the optical fiber 4 (see FIG. 1). The metallic coating member 9 is preferably provided between the optical fiber 4 and the solder 8 in order to facilitate the soldering of the optical fiber 4 to the bonding pad 7 by the solder 8. This is because, as early described, an outer skin of the optical fiber 4 in the solder 8 is the clad part made of glass which is not suitable for soldering with solder. Under the circumstances, the metallic coating member 9 is provided so that the optical fiber 4 is joined to the solder 8 via the metallic coating member 9.

(Optical Fiber Supporting Member 5)

As above described, the optical fiber supporting member 5 of the present invention has the cantilever configuration. This makes it possible to suppress a positional displacement of the optical fiber 4 in the Z axis direction which displacement significantly affects a change in optical coupling efficiency between the semiconductor laser element 2 and the optical fiber 4.

The following description will discuss, in detail, the configuration of the optical fiber supporting member 5 and the above effect.

Figure 3:
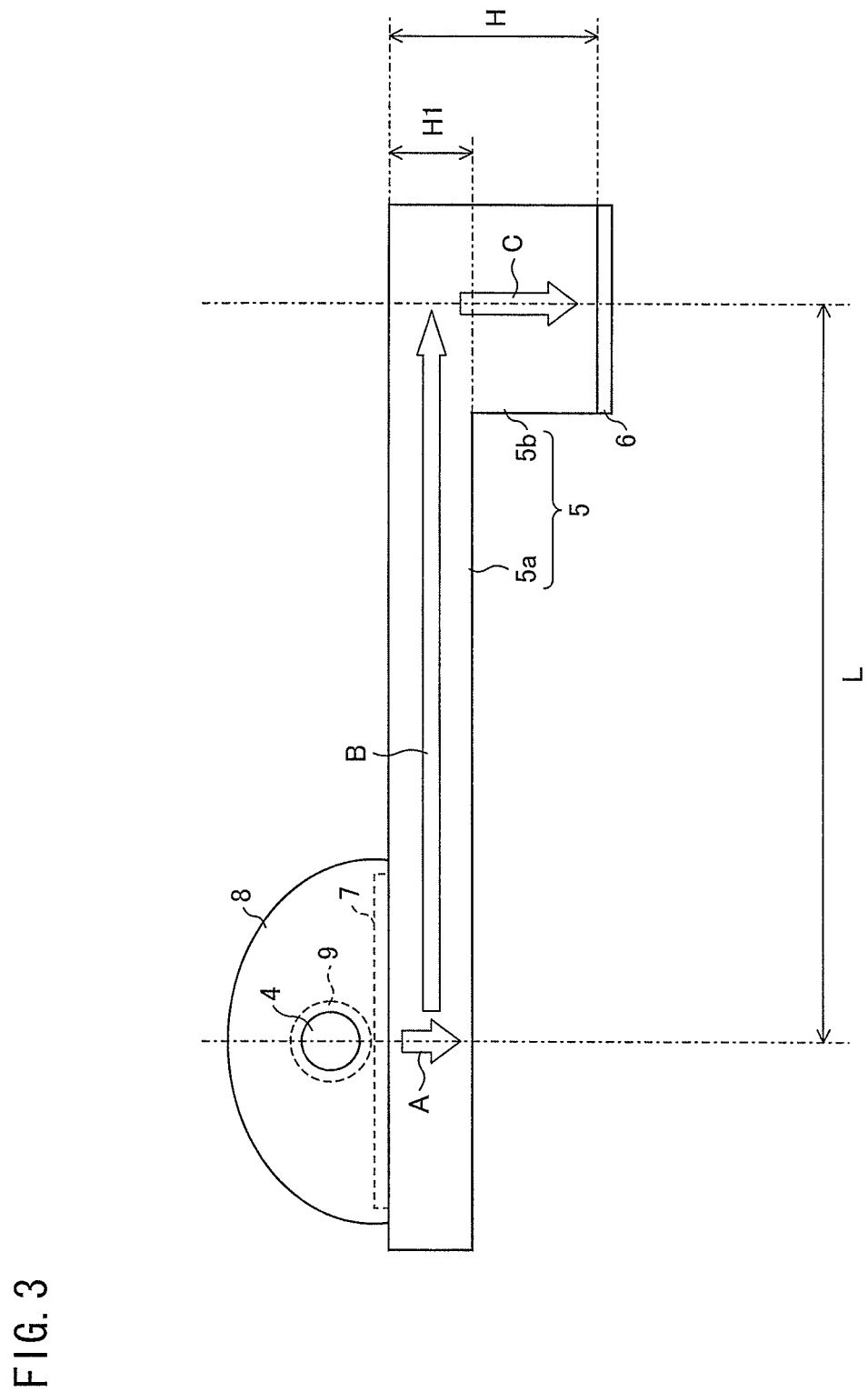
FIG. 3

FIG. 3 illustrates (i) the optical fiber supporting member 5 shown in FIGS. 1 and 2 and (ii) peripheral parts of the optical fiber supporting member 5. As early described, the optical fiber supporting member 5 includes the beam part 5a and the pillar part 5b (see FIG. 3).

Specifically, the beam part 5a has (i) a main surface (first main surface) provided with the bonding pad 7 to which the optical fiber 4 is fixed by the solder 8 and (ii) another main surface (second main surface) opposite to the main surface. The beam part 5a (i) has the flat-plate shape as early described and (ii) is joined to the pillar part 5b in a location at or near one of ends of the beam part 5a, which ends are located in the longitudinal direction of the beam part 5a. The another main surface of the beam part 5a faces the base 1.

On the other hand, the pillar part 5b is fixed to the base 1 as early described. The pillar part 5b (i) is joined to the beam part 5a in a location at or near the one of ends of the beam part 5a which ends extend in a shorter side direction of the beam part 5a and (ii) supports the beam part 5a such that the beam part 5a is located above the base 1, i.e., such that the another main surface of the beam part 5a faces the base 1 while being spatially away from the base 1.

Each of the beam part 5a and the pillar part 5b is made of a heat conductive material having a high heat conductivity, as early described.

In the optical fiber supporting member 5 including the beam part 5a and the pillar part 5b which are joined together and are made of the heat conductive material, the beam part 5a, which is located under the bonding pad 7 to which the optical fiber 4 is fixed, has a thickness H1, and the thickness H1 is thinner than a thickness defined by the height H (hereinafter, this configuration is referred to as "Feature 1"), where the optical fiber 4 is located at the height H from the base 1. Note that thicknesses of respective of the bonding film 6 and the bonding pad 7 are not considered here, and the height H at which the optical fiber 4 is located is assumed to be determined only by a thickness of the optical fiber supporting member 5.

Moreover, the bonding pad 7 is distant from the pillar part 5b by a distance L (hereinafter, this configuration is referred to as "Feature 2").

The optical fiber supporting member 5 thus having the Feature 1 and Feature 2 can suppress the early described positional displacement of the optical fiber 4 in the Z axis direction.

According to Feature 1, the thickness H1 of the optical fiber supporting member 5 located under the bonding pad 7 is thinner than a conventional thickness equivalent to the height H at which the optical fiber 4 is located. With the configuration, it is possible to reduce a degree of positional displacement of the optical fiber 4 in the Z axis direction, which displacement is caused by a thermal expansion of the optical fiber supporting member 5 under the bonding pad 7.

On the other hand, according to the conventional laser diode assembly disclosed in Patent Literature 1, laser light, which (i) has been emitted from the semiconductor laser element and (ii) does not enter the core part of the optical fiber, causes the base to be locally expanded under the optical fiber. As a result, the optical fiber is positionally displaced significantly.

Figure 4:
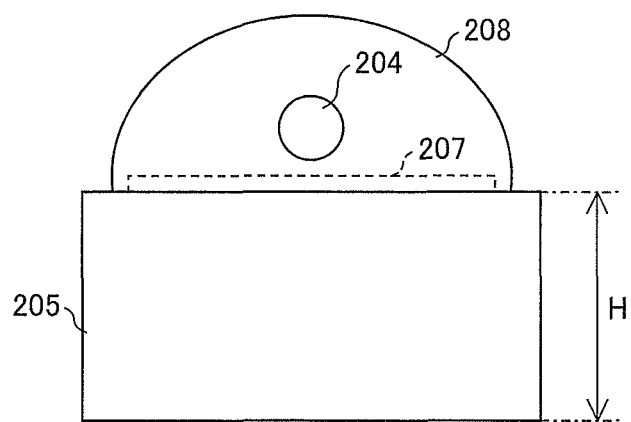
FIG. 4

For example, in a conventional configuration illustrated in FIG. 4, an optical fiber 204 is fixed, by solder 208, to a bonding pad 207 provided on an optical fiber supporting member 205. In this case, a height H at which the optical fiber 204 is provided is defined by (i.e., identical with) a thickness of the optical fiber supporting member 205. Moreover, the optical fiber supporting member 205 is made of a heat insulating material, and therefore heat in a lower part of the optical fiber 204 is difficult to release.

According to the conventional configuration, once the optical fiber 204 starts to generate heat by being irradiated with laser light which does not enter the core part of the optical fiber 204, the heat expands the optical fiber supporting member 205 under the optical fiber 204, and further the expansion causes a positional displacement of the optical fiber 204.

This consequently causes a vicious cycle in which an amount of laser light, which does not enter the optical fiber 204, is increased.

On the other hand, according to the configuration of the optical fiber supporting member 5 illustrated in FIG. 3, the optical fiber supporting member 5 under the bonding pad 7 has a reduced thickness. Therefore, even when the bonding pad 7 starts to generate heat by being irradiated with laser light which does not enter the core part of the optical fiber 4, a positional displacement of the optical fiber 4 in the Z axis direction, which displacement is caused by a thermal expansion of the thinner part of the optical fiber supporting member 5, is drastically reduced as compared with the conventional technique.

Moreover, according to the configuration of the optical fiber supporting member 5 illustrated in FIG. 3, the optical fiber supporting member 5 is made of a heat conductive material. This causes the heat, generated by the optical fiber 4, to be (i) conducted in the optical fiber supporting member 5 in directions indicated by arrows A, B, and C of FIG. 3 and then (ii) efficiently released from the base 1.

This makes it possible to suppress a thermal expansion of the optical fiber supporting member 5 under the bonding pad 7, and therefore a degree of positional displacement of the optical fiber 4 in the Z axis direction can be significantly reduced, as compared with the conventional technique.

According to Feature 2, the bonding pad 7, which is to generate heat by being irradiated with laser light, can be distant from the pillar part 5b by the distance L. This makes it possible to suppress a thermal expansion of the pillar part 5b caused by heat generated by the bonding pad 7.

According to the configuration illustrated in FIG. 3, the height H at which the optical fiber 4 is located is defined by the thickness (=H) of the pillar part 5b. Under the circumstances, if the pillar part 5b is expanded greatly by heat generated by the bonding pad 7, the optical fiber 4 would be positionally displaced, although not as greatly as the conventional technique.

According to Feature 2, the bonding pad 7 is distant from the pillar part 5b by the distance L so that heat is released from surfaces of the optical fiber supporting member 5. This prevents the pillar part 5b from being expanded significantly by the heat generated by the bonding pad 7.

With the configuration, it is possible to significantly reduce a degree of positional displacement of the optical fiber 4, as compared with the conventional technique.

As thus described, according to the laser device 100 of the present embodiment, (i) the beam part 5a located under the bonding pad 7 has a reduced thickness and (ii) the heat conductivity of the beam part 5a is heightened. Therefore, even when the bonding pad generates heat by being irradiated with laser light which (i) has been emitted from the emission surface 2a of the semiconductor laser element 2 and (ii) does not enter the optical fiber 4 fixed to the bonding pad 7, it is possible to suppress a thermal expansion of the beam part 5a caused by the heat generated by the bonding pad 7. As a result, it is possible to reduce a degree of positional displacement of the optical fiber 4 in the Z axis direction.

Further, the pillar part 5b joined to the base 1 is apart from the bonding pad 7 and the pillar part 5b has high heat conductivity. This suppresses a thermal expansion of the pillar part 5b caused by the heat generated by the bonding pad 7. As a result, it is possible to reduce a degree of positional displacement of the optical fiber 4 in the Z axis direction.

Modified Example 1

Figure 5:
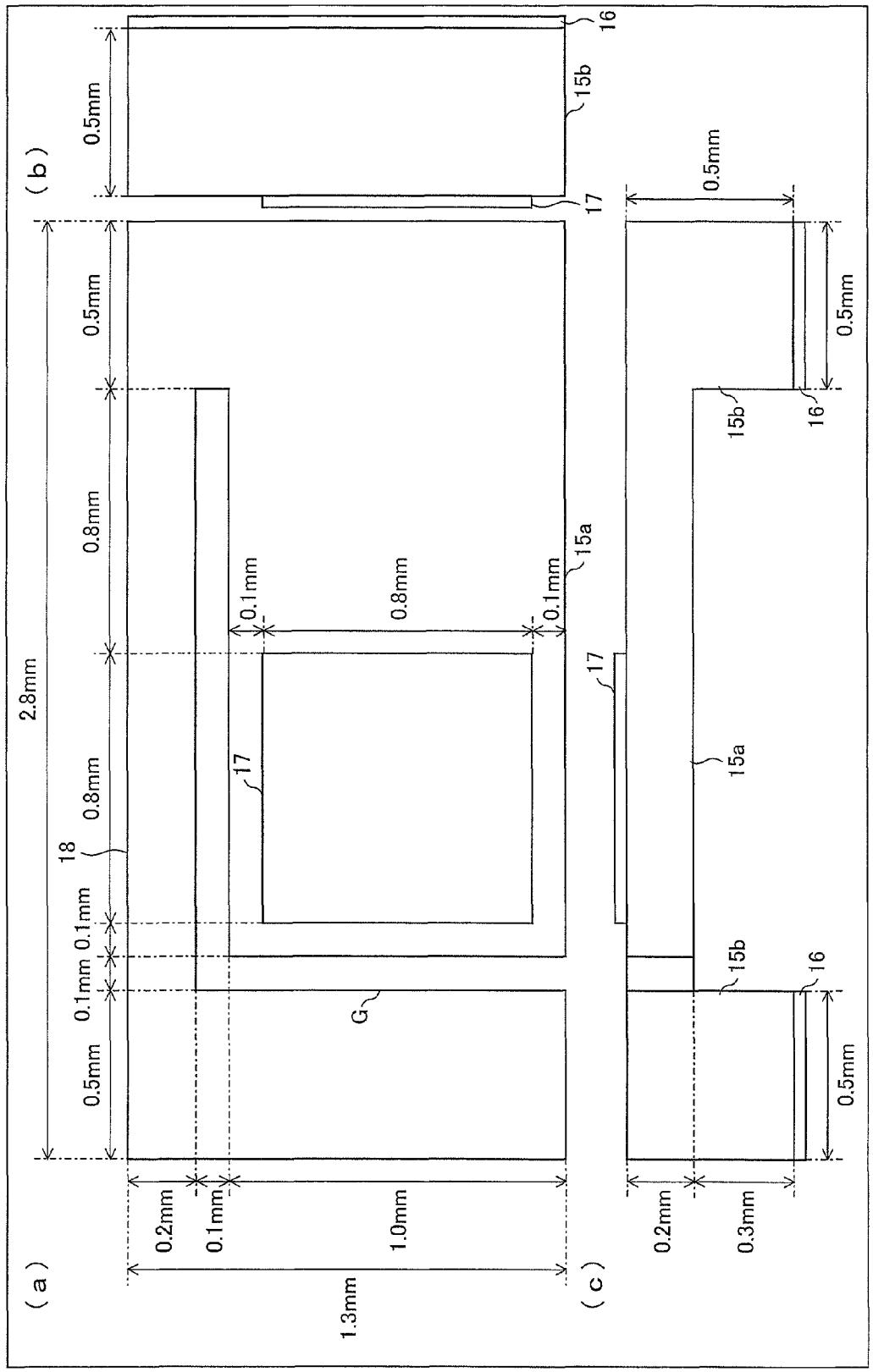
FIG. 5

FIG. 5 schematically illustrates a configuration of Modified Example 1 of the optical fiber supporting member 5 included in the laser device 100 of the above-described embodiment. FIG. 5 is a three-view drawing illustrating Modified Example 1 of the optical fiber supporting member 5 illustrated in FIG. 1. (a) of FIG. 5 is a plane view illustrating a modified optical fiber supporting member of Modified Example 1 viewed in the Z axis direction of FIG. 1. (b) of FIG. 5 is a lateral view illustrating the modified optical fiber supporting member viewed in the X axis direction of FIG. 1. (c) of FIG. 5 is a lateral view illustrating the modified optical fiber supporting member viewed in the Y axis direction of FIG. 1.

The modified optical fiber supporting member of Modified Example 1 is different from the optical fiber supporting member 5 in that a beam part 15a, which has an opening part G, is provided instead of the beam part 5a of the optical fiber supporting member 5. The beam part 15a has an arm part 18 which is formed into an L shape by the opening part G (see (a) of FIG. 5). Further, two pillar parts 15b are provided on the beam part 15a in respective locations at or near both ends of the beam part 15a, which ends are located in a longitudinal direction of the beam part 15a. That is, one of the two pillar parts 15b is provided on an end portion of the arm part 18. The two pillar parts 15b are joined to a base 1 via respective bonding films 16.

The pillar part 15b, the bonding film 16, and a bonding pad 17 of Modified Example 1 are identical with the pillar part 5b, the bonding film 6, and the bonding pad 7, respectively, of the optical fiber supporting member 5. The beam part 15a is basically identical with the beam part 5a of the optical fiber supporting member 5 except that the beam part 15a has the opening part G and the arm part 18.

Modified Example 1 can bring about an effect similar to that of the optical fiber supporting member 5 of the above-described embodiment.

According to Modified Example 1, the beam part 15a has the opening part G such that the beam part 15a has a cantilever configuration in which the two pillar parts 15b are provided at or near the both ends of the beam part 15a, which ends are located in the longitudinal direction of the beam part 15a. With the configuration, it is possible to easily cause the beam part 15a to be in parallel with the base 1, as compared to the foregoing embodiment of the present invention.

Modified Example 2

Figure 6:
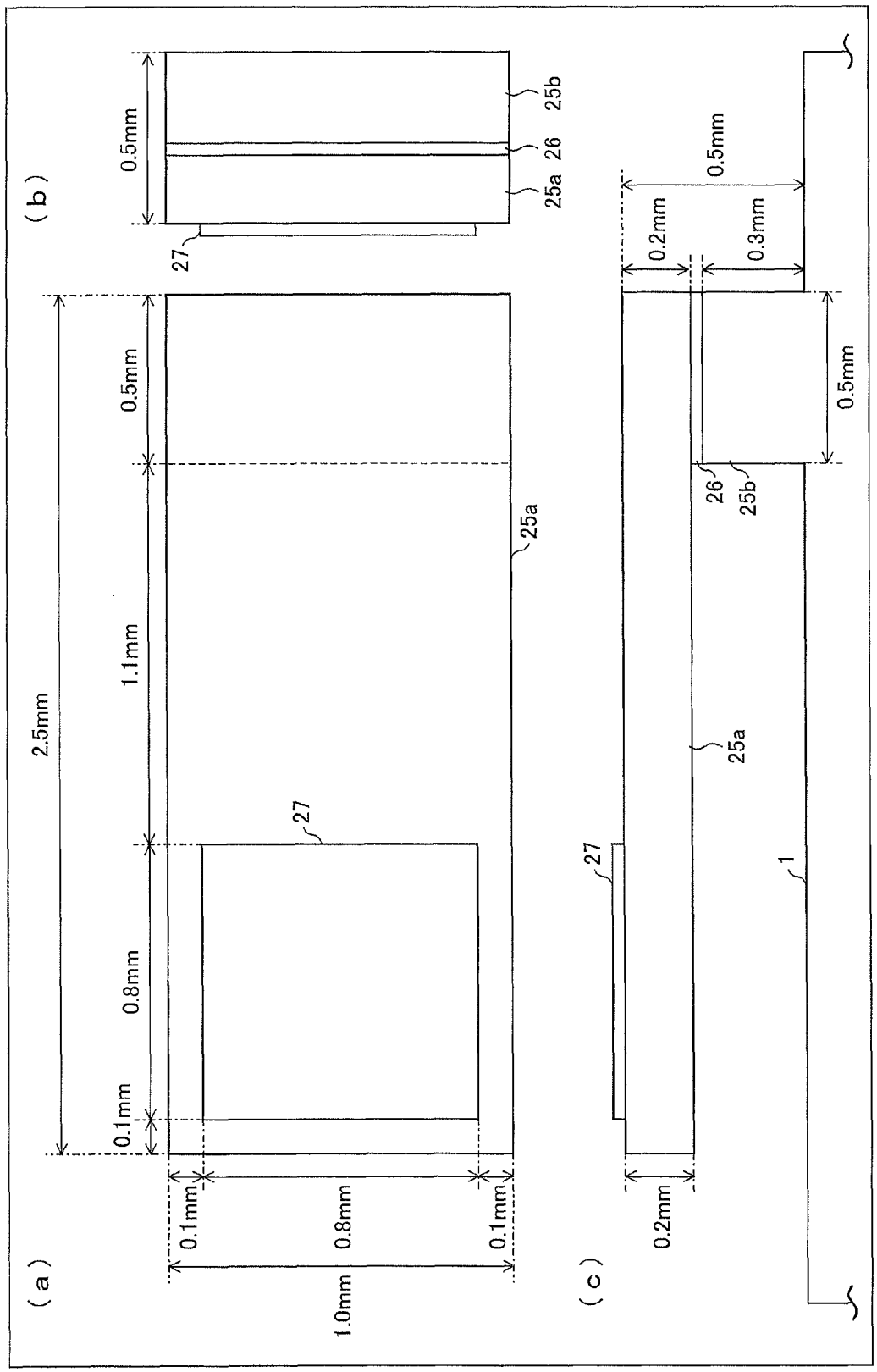
FIG. 6

FIG. 6 schematically illustrates a configuration of Modified Example 2 of the optical fiber supporting member 5 included in the laser device 100 of the above-described embodiment. FIG. 6 is a three-view drawing illustrating Modified Example 2 of the optical fiber supporting member 5 illustrated in FIG. 1. (a) of FIG. 6 is a plane view illustrating a modified optical fiber supporting member of Modified Example 2 viewed in the Z axis direction of FIG. 1. (b) of FIG. 6 is a lateral view illustrating the modified optical fiber supporting member viewed in the X axis direction of FIG. 1. (c) of FIG. 6 is a lateral view illustrating the modified optical fiber supporting member viewed in the Y axis direction of FIG. 1.

The modified optical fiber supporting member of Modified Example 2 is different from the optical fiber supporting member 5 in that a pillar part 25b, which is integrated with a base 1, is provided instead of the pillar part 5b of the optical fiber supporting member 5.

By forming the pillar part 25b and the base 1 in one (1) piece, (i) it is unnecessary to separately form the pillar part 25b and (ii) it is possible to form a beam part 25a into a simple plate shape. The integral formation of the pillar part 25b and the base 1 can be easily carried out by, for example, forming the base 1 with a cutting process or a pressing process. This allows an omission of a separate process for preparing the pillar part 25b.

Moreover, the beam part 25a can be formed into the flat-plate shape, which can be easily formed. This allows a simplification in forming process of the beam part 25a, and high processing accuracy is not required for forming the beam part 25a by the cutting process.

According to Modified Example 2, it is possible to reduce cost for producing the optical fiber supporting member.

Note that a bonding film 26 and a bonding pad 27 of Modified Example 2 are identical with the bonding film 6 and the bonding pad 7, respectively, of the optical fiber supporting member 5. The bonding film 26 is made of, for example, solder. The bonding film 26 generally has a thickness of approximately 5 μm to 30 μm. Note that the thickness of the bonding film 26 is merely schematically illustrated in FIG. 6, for convenience of visibility.

Modified Example 2 can also bring about an effect similar to that of the optical fiber supporting member 5 of the above-described embodiment.

The present invention is not limited to the embodiments, but can be altered by a skilled person in the art within the scope of the claims. An embodiment derived from a proper combination of technical means disclosed in respective different embodiments is also encompassed in the technical scope of the present invention.

Note that the present invention can also be expressed as follows: that is, a laser device of the present invention includes: a laser element having an emission surface from which laser light is emitted; an optical fiber having an end part facing the emission surface; and a supporting member for supporting the optical fiber, the supporting member having a fiber fixing section to which the optical fiber is fixed by solder, the supporting member including: a plate part having (i) a first main surface on which the fiber fixing section is provided and (ii) a second main surface opposite to the first main surface, and a columnar part fixed to a heat releasing member, the columnar part being joined to the plate part in a location at or near an end of the plate part such that the second main surface and the heat releasing member face each other while being spatially away from each other.

According to the laser device, the supporting member for supporting the optical fiber has the plate part for fixing the optical fiber and the columnar part fixed to the heat releasing member. The columnar part is provided such that the plate part is spatially away from the heat releasing member. This allows a reduction in thickness of a part of the supporting member which part is located under the fiber fixing section for fixing the optical fiber.

According to the configuration, even when the fiber fixing section starts to generate heat by being irradiated with laser light which (i) has been emitted from the emission surface and (ii) does not enter a core part of the optical fiber, it is possible to reduce a degree of positional displacement of the optical fiber in the thickness direction of the plate part which displacement is caused by a thermal expansion of the supporting member under the fiber fixing section, as compared with a case where the supporting member under the fiber fixing section is thick, that is, the supporting member under the fiber fixing section is directly fixed on the heat releasing member.

It is therefore possible to suppress a decrease in optical coupling efficiency between the laser element and the optical fiber by suppressing heat generation and melting of the fiber fixing section for fixing the optical fiber.

It is preferable that the supporting member is made of a heat conductive material.

Since the supporting member is made of the heat conductive material, heat generated by the fiber fixing section is conducted in the supporting member and then efficiently released from the base.

This allows a reduction in temperature of the supporting member under the fiber fixing section, as compared with a case where a heat insulating material is used as a member for supporting a fiber.

It is therefore possible to reduce a degree in positional displacement of the optical fiber caused by a thermal expansion of the supporting member, as compared with the case where a heat insulating material is used as a member for supporting a fiber.

This makes it possible to effectively prevent a decrease in optical coupling efficiency between the laser element and the optical fiber by suppressing heat generation and melting of the fiber fixing section for fixing the optical fiber.

It is preferable that the columnar part is joined to the plate part in a location at or near one of two ends of the plate part, the two ends being located in a longitudinal direction of the plate part; and the fiber fixing section is provided on the plate part in a location at or near the other of the two ends.

According to the configuration, the columnar part is distant, by a length of the plate part in the longitudinal direction, from the fiber fixing section which is to generate heat by being irradiated with laser light which (i) has been emitted from the emission surface and (ii) does not enter the core part of the optical fiber.

As such, a long distance can be secured between the fiber fixing section and the columnar part. This makes it possible to suppress a thermal expansion of the columnar part caused by the heat generated by the fiber fixing section.

That is, the fiber fixing section is caused to be away from the columnar part by a long distance so that the columnar part will not be largely expanded by the heat generated by the fiber fixing section. This allows a further reduction in positional displacement of the optical fiber.

This makes it possible to effectively prevent a decrease in optical coupling efficiency between the laser element and the optical fiber by suppressing heat generation and melting of the fiber fixing section for fixing the optical fiber.

It is preferable that the optical fiber is fixed to the fiber fixing section so as to extend perpendicular to a direction in which the plate part extends from the columnar part.

According to the configuration, the optical fiber is fixed to the fiber fixing section so as to extend perpendicular to a direction in which the plate part extends from the columnar part. In other words, the optical fiber extends perpendicular to the longitudinal direction of the plate part.

In a case where the plate part is expanded by the heat generated by the fiber fixing section, the plate part is elongated in the longitudinal direction. This causes a longitudinal direction displacement of the end part of the optical fiber fixed to the fiber fixing section, because the optical fiber extends perpendicular to the longitudinal direction.

Therefore, the displacement of the end part of the optical fiber occurs in a lateral direction on the emission surface in which direction the laser light spreads less widely. This makes it possible to further suppress a decrease in optical coupling efficiency between the laser element and the optical fiber.

In a case where the optical fiber extends in parallel with the longitudinal direction of the plate part, the end part of the optical fiber is to be positionally displaced in a direction in which laser light is emitted. In this case, a decrease in optical coupling efficiency, which is caused by a positional displacement of the fiber in the laser emission direction (i.e., Y axis direction in FIG. 1), becomes greater than a decrease caused by a positional displacement in the lateral direction (i.e., X axis direction in FIG. 1) on the emission surface. Therefore, if the optical fiber extends in parallel with the longitudinal direction, the optical coupling efficiency between the laser element and the optical fiber will be decreased more greatly.

Under the circumstances, the configuration of the present invention makes it possible to effectively prevent a decrease in optical coupling efficiency between the laser element and the optical fiber by suppressing heat generation and melting of the fiber fixing section for fixing the optical fiber.

It is preferable that, in a case where (i) first and second directions perpendicular to each other are set on the emission surface and (ii) laser light emitted from the emission surface spreads more widely in one of the first and second directions than in the other of the first and second directions, the laser element is provided such that the one of the first and second directions becomes identical with a thickness direction of the plate part.

According to the configuration, it is possible to conform the thickness direction of the plate part to the direction in which the laser light spreads more widely and affects more greatly on a positional displacement of the optical fiber.

From this, the direction in which the laser light spreads more widely can be conformed to the direction in which a degree of positional displacement of the optical fiber can be reduced. Consequently, it is possible to reduce a degree of positional displacement of the optical fiber in the direction in which the laser light spreads more widely.

This makes it possible to effectively prevent a decrease in optical coupling efficiency between the laser element and the optical fiber by suppressing heat generation and melting of the fiber fixing section for fixing the optical fiber.

It is preferable that the plate part and the columnar part are not integrated so as to be separate members.

According to the configuration, the plate part and the columnar part can be formed into shape such as a flat-plate shape and a rectangular parallelepiped shape, respectively, which can be formed easily. Therefore, in a case where such shapes are formed by a cutting process, high processing accuracy is not required and therefore formation cost of each of the plate part and the columnar part can be reduced.

It is preferable that the plate part and the columnar part are integrated in one (1) piece.

According to the configuration, the plate part and the columnar part can be formed concurrently. This makes it possible to simplify processes for forming the plate part and the columnar part, and therefore formation cost of each of the plate part and the columnar part can be reduced.

It is preferable that the columnar part and the heat releasing member are integrated in one (1) piece.

According to the configuration, the plate part can be formed into a shape which can be easily formed. Meanwhile, the columnar part and the heat releasing member can be formed concurrently. Therefore, (i) high processing accuracy is not required for carrying out a cutting process on the plate part and (ii) a forming process of the columnar part can be simplified. This allows a reduction in formation cost of each of the plate part and the columnar part.

INDUSTRIAL APPLICABILITY

The present invention is applicable to a laser device including (i) a laser element such as a semiconductor laser element and (ii) an optical component such as an optical fiber.

REFERENCE SIGNS LIST

1: Base (heat releasing member)
2: Semiconductor laser element (laser element)
2a: Emission surface
3: Laser element supporting member
4 and 204: Optical fiber
4a: End part
5 and 205: Optical fiber supporting member (supporting member)
5a and 15a: Beam part (plate part)
5b and 15b: Pillar part (columnar part)
6 and 16: Bonding film
7, 17, and 207: Bonding pad (fiber fixing section)
8 and 208: Solder
9: Metallic coating member
18: Arm part
100: Laser device

The invention claimed is:

1. A laser device comprising:
a laser element having an emission surface from which laser light is emitted;
an optical fiber having an end part facing the emission surface; and
a supporting member for supporting the optical fiber, the supporting member having a bonding pad on which the optical fiber is fixed by solder,
the supporting member including:
a plate part having a width extending in a width-wise direction, a first longitudinal end and a second longitudinal end in a longitudinal direction perpendicular to the width-wise direction and having (i) a first main surface on which the bonding pad is provided at the first longitudinal end of the plate part and (ii) a second main surface opposite to the first main surface in a vertical direction perpendicular to the longitudinal direction and the width-wise direction; and
a columnar part having a first vertical end and a second vertical end in the vertical direction and fixed to a heat releasing member on the first vertical end, and the second vertical end of the columnar part being attached on the second main surface of the plate part at the second longitudinal end of the plate part such that the second main surface and the heat releasing member face each other while being spatially away from each other.

2. The laser device as set forth in claim 1, wherein:
the supporting member is made of a heat conductive material.

3. The laser device as set forth in claim 1, wherein:
the optical fiber is fixed to the bonding pad so as to extend in the width-wise direction.

4. The laser device as set forth in claim 1, wherein:
the emission surface comprising a first and second directions perpendicular to each other and the laser light emitted from the emission surface spreads more widely in one of the first and second directions than in the other of the first and second directions, and
wherein the laser element is provided such that the one of the first and second directions corresponds to a thickness direction of the plate part.

5. The laser device as set forth in claim 1, wherein:
the plate part and the columnar part are not integrated so as to be separate members.

6. The laser device as set forth in claim 1, wherein:
the plate part and the columnar part are integrated in one (1) piece.

7. The laser device as set forth in claim 1, wherein:
the columnar part and the heat releasing member are integrated in one (1) piece.

* * * * *